United States Patent [19]
Roney, IV

[11] Patent Number: 5,453,997
[45] Date of Patent: Sep. 26, 1995

[54] DECODER SELECTION

[75] Inventor: Edward M. Roney, IV, Grayslake, Ill.

[73] Assignee: Motorola, Schaumburg, Ill.

[21] Appl. No.: 386,248

[22] Filed: Feb. 9, 1995

Related U.S. Application Data

[63] Continuation of Ser. No. 26,835, Mar. 5, 1993, abandoned.
[51] Int. Cl.$^6$ ............................. G06F 11/10; H03M 13/00
[52] U.S. Cl. ............................. 371/41; 371/5.1; 371/43; 455/39; 375/316; 375/341
[58] Field of Search ........................ 371/5.1, 5.4, 5.5, 371/30, 41, 43; 455/56.1, 54.1, 39; 375/340, 261, 225, 243, 316, 341, 343

[56] References Cited

U.S. PATENT DOCUMENTS

| | | | |
|---|---|---|---|
| 3,078,443 | 2/1963 | Rose | 371/41 |
| 4,701,923 | 10/1987 | Fukasawa et al. | 371/41 |
| 5,051,999 | 9/1991 | Erhart et al. | 371/41 |
| 5,060,266 | 10/1991 | Dent | 380/50 |
| 5,140,627 | 8/1992 | Dahlin et al. | 379/60 |
| 5,157,672 | 10/1992 | Kondou et al. | 371/43 |
| 5,182,753 | 1/1993 | Dahlin et al. | 371/43 |
| 5,287,556 | 2/1994 | Cahill | 455/260 |
| 5,299,070 | 3/1994 | Takahashi et al. | 370/19.1 |
| 5,335,356 | 8/1994 | Anderson | 455/54.1 |
| 5,379,324 | 1/1995 | Mueller et al. | 375/94 |
| 5,384,809 | 1/1995 | Yagi et al. | 375/39 |
| 5,392,300 | 2/1995 | Borth et al. | 371/37.7 |
| 5,402,447 | 3/1995 | Roney, IV | 375/340 |
| 5,408,499 | 4/1995 | Sasaki | 375/286 |

*Primary Examiner*—Robert W. Beausoliel, Jr.
*Assistant Examiner*—Albert Decady
*Attorney, Agent, or Firm*—Kevin D. Kaschke

[57] ABSTRACT

The process of the present invention receives encoded data over a channel, decodes the data, and estimates the number of errors induced by the channel. The proper convolutional decoder is chosen by comparing the bit error rates to a threshold that is biased in favor of the FACCH message being present on the channel. The selection process of the present invention requires reduced processing time by the processor thereby reducing the power requirements of the processor.

22 Claims, 3 Drawing Sheets

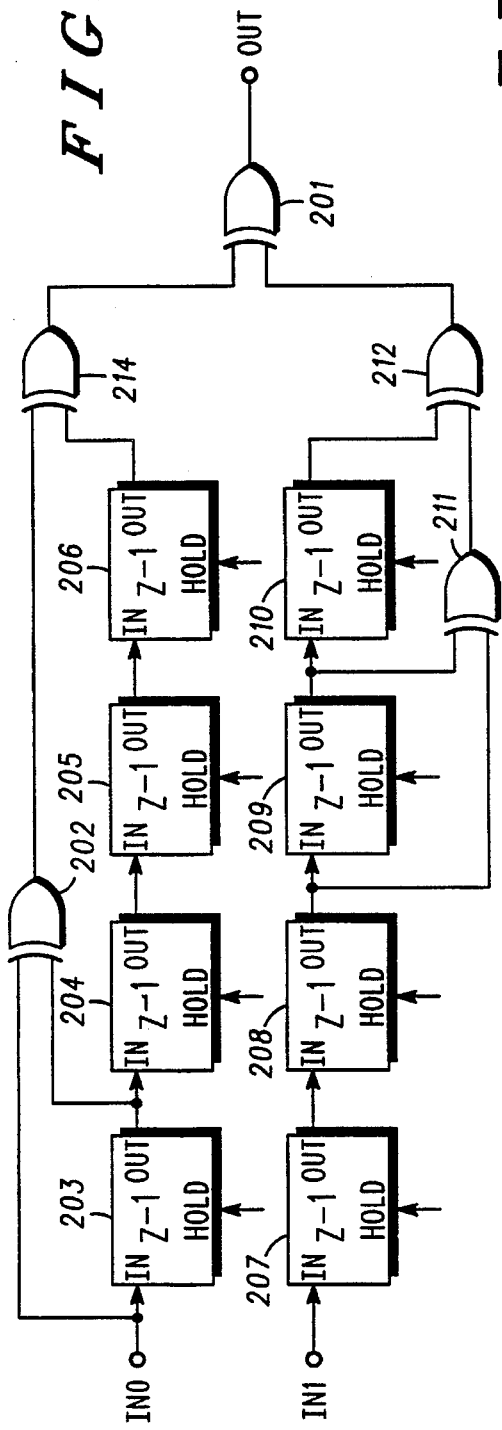
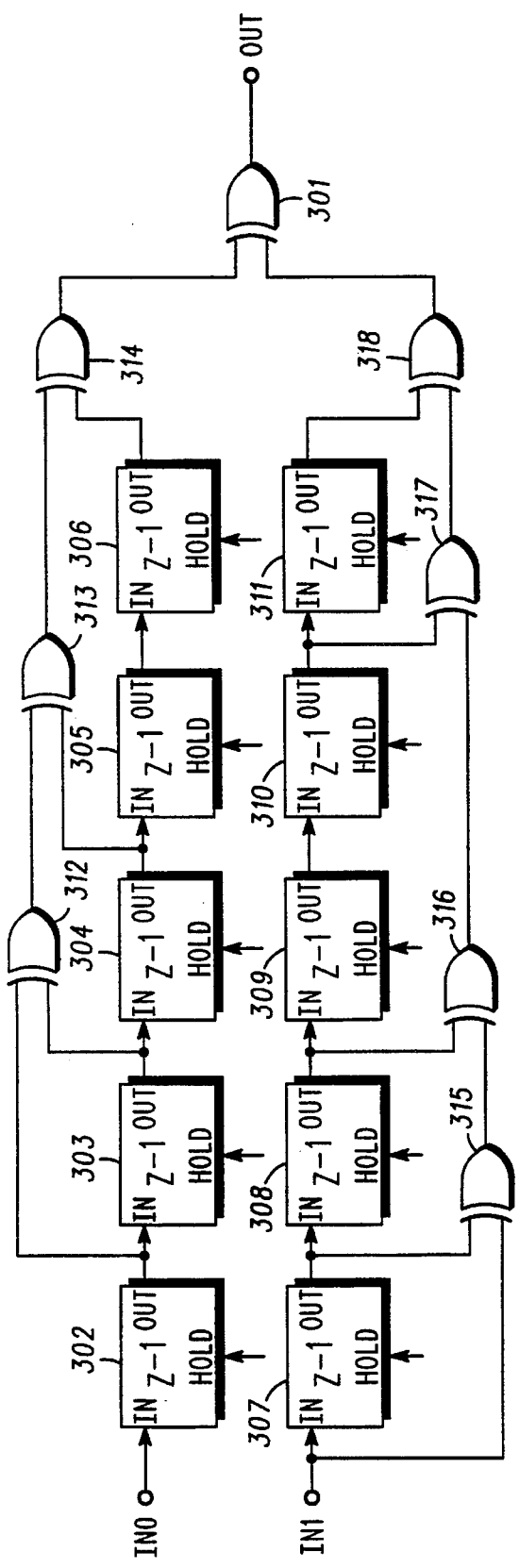

DECODER SELECTION

This is a continuation of application Ser. No. 08/026,835, filed Mar. 5, 1993 and now abandoned

FIELD OF THE INVENTION

The present invention relates generally to the field of communications and particularly to decoding convolutionally encoded data.

BACKGROUND OF THE INVENTION

As communication devices become more complex, they typically have larger power requirements. This, in part, is due to complex software requiring the processor to operate for long periods of time and/or at a higher clock rate. Both conditions causing the processor to draw more current. In a portable, battery powered device, this depletes the battery's power quicker.

The processor in a communication device such as a radiotelephone performs processes to generate the bit error rate (BER) of user information and control signals transmitted from the base station. The EIA/TIA specification uses user information to denote the speech parameters generated by the vocoder. The BER can be used by the processor to mute audio, as a display indication, FACCH or user information determination, and channel quality estimation.

The control signals are transmitted over a control channel that is referred to in the art as a Fast Associated Control Channel (FACCH). This channel is a blank-and-burst channel for signalling message exchange between the base station and the mobile station.

FACCH decoding is performed before user information decoding. This is due to the lack of robustness in the cyclic redundancy check (CRC) performed after user information decoding to determine the validity of the user information; FACCH data will be mistaken for user information, thus losing the FACCH message.

FACCH and speech convolutionally encoded data share the same location during transmission, therefore only one message type can be present at any one time. Because speech convolutionally encoded data is transmitted more frequently than FACCH convolutionally encoded data, the execution of the FACCH decoding algorithms before the user information decoding algorithms becomes wasteful of instruction cycles and thus current drain. It is unknown whether a FACCH message or user information is going to be received. Therefore, both must be checked using million instructions per second (MIPS) exhaustive algorithms.

As discussed above, the BER estimation process is an important one that requires a large number of MIPS. Reducing this requirement would reduce the current requirement of the processor in addition to freeing the processor to do other tasks. There is a resulting need for a process to estimate the BER of a signal using a minimum amount of processor time.

SUMMARY OF THE INVENTION

In a receiver operable to receive an encoded signal generated by one of a plurality of encoding processes, a method selects one of a plurality of decoding processes to decode the encoded signal. A plurality of bit error rate estimates for the encoded signal is generated. The plurality of bit error rate estimates correspond to the encoded signal being generated by the plurality of encoding processes. A bit error rate estimate of the plurality of bit error rate estimates having the most favorable value is determined. The one of the plurality of decoding processes is selected, corresponding to the one of the plurality of encoding processes, for decoding the encoded signal responsive to the bit error rate estimate having the most favorable value

BRIEF DESCRIPTION OF THE DRAWINGS

FIG. 2 shows a block diagram of a first rate-½ decoder.

FIG. 3 shows a block diagram of a second rate-½ decoder.

DETAILED DESCRIPTION OF THE PREFERRED EMBODIMENT

Figure 1:
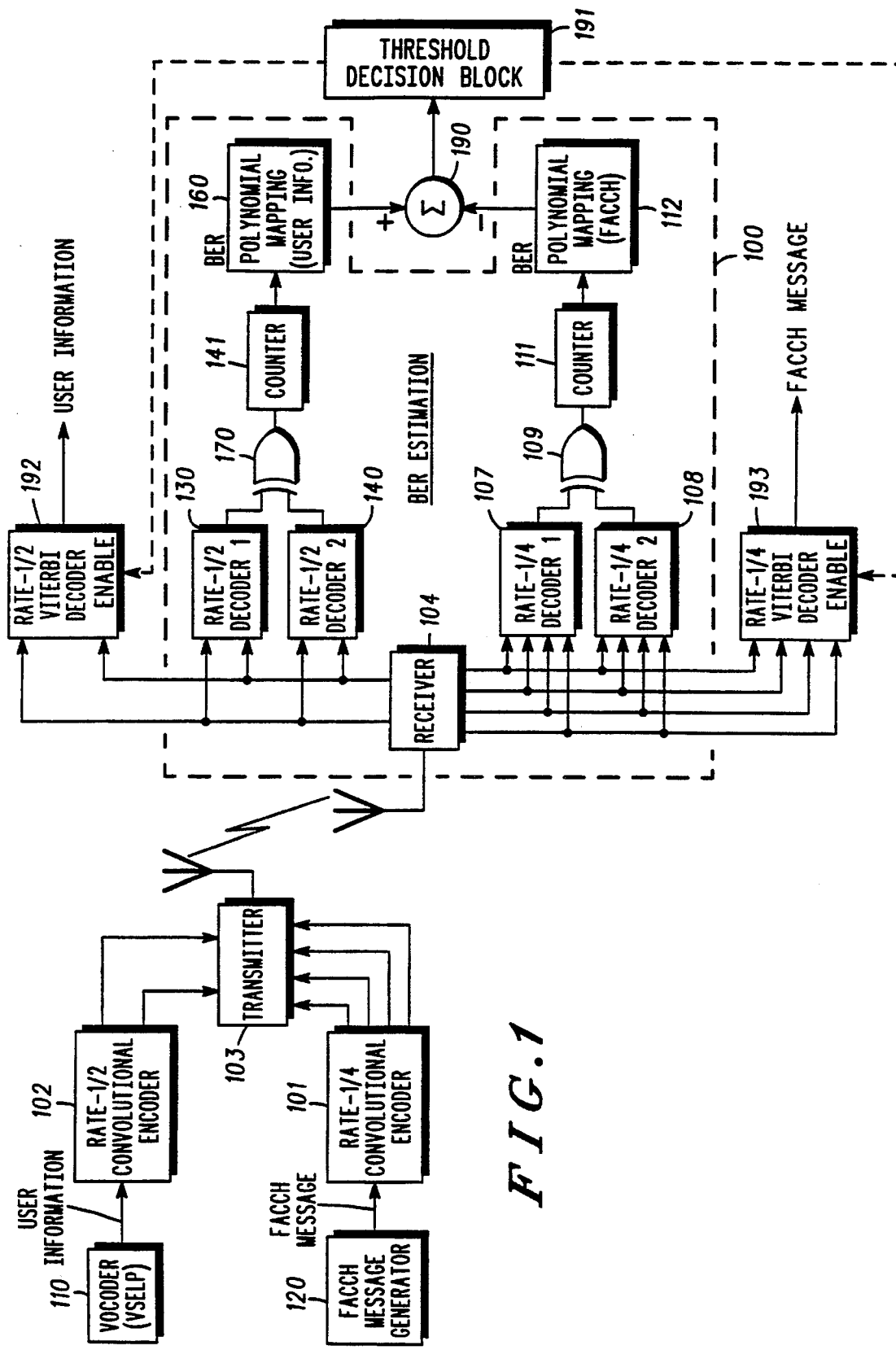
FIG. 1 Shows a block diagram of the process of the present invention.

A block diagram of the BER estimation process of the present invention (100) is illustrated in FIG. 1. FIG. 1 additionally illustrates the system of which the BER estimation process (100) is a part.

Referring to FIG. 1, the system is comprised of two paths: a user information path and a FACCH message path. The user information that, in the preferred embodiment, are speech parameters determined and encoded by the speech coder (110) using a code excited linear predictive coding technique. In the preferred embodiment, this technique is referred to as vector-sum excited linear predictive (VSELP) coding. A technical description of this technique, Vector Sum Excited Linear Prediction 13000 Bit Per Second Voice Coding Algorithm Including Error Control for Digital Cellular, is published by and available from Motorola Inc.

The baseband user information is then run through a rate-½ convolutional encoder (102). This encoder is comprised of generator polynomials that add redundancy to the speech data for error correction purposes. The generator polynomials are as follows:

$$g_0(D)=1+D+D^3+D^5$$

$$g_1(D)=1+D^2+D^3+D^4+D^5$$

These equations are referenced in Interim Standard-54 (Rev. A) from the Electronic Industries Association.

'D' represents the delay operator, the power of 'D' denoting the number of time units a bit is delayed with respect to the initial bit in the sequence. This notation is defined by Shu Lin and Daniel Costello in Error Control Coding: Fundamentals and Applications, (1983), p. 330.

The outputs from the rate-½ convolutional encoder (102) are input to a transmitter (103) for transmission over the channel. FACCH and user information cannot be sent simultaneously. The FACCH message replaces the user information whenever system considerations deem it appropriate. The signal is received by a receiver (104) and the convolutionally encoded user information is input to the BER estimation process of the present invention (100).

The received convolutionally encoded user information is input to two separate and distinct rate-½ decoders (130 and 140) containing polynomials that are the inverses of the generator polynomials used in the rate-½ convolutional encoding transfer function. The outputs of these decoders (130 and 140) will be an estimate of the original data before rate-½ convolutional encoding. By using two separate and distinct decoders representing the inverse of the original encoder, the decoder outputs, when errors are induced, will also be distinct. The polynomials used in the first rate-½ decoder (130) are:

$$h_0(D)=1+D^1+D^4$$

$$h_1(D)=D^2+D^3+D^4$$

The first decoder (130) is illustrated in FIG. 2. This decoder (130) is comprised of two input paths that are XORed (201) to generate the output data. The first input path XORs (202) one of the input signals with the same input signal delayed by one unit of delay (203). The output of this XOR operation (202) is itself XORed (214) with this first input delayed by four units of delay (203–206). The second input path first XORs (211) the second input signal delay with two units of delay (207 and 208) with the same input signal delayed by three units of delay (207–209). The output of this XOR operation (211) is then XORed (212) with the second input signal delayed by four units of delay (207–210).

The second rate-½ decoder (140) uses the following polynomials and is illustrated in FIG. 3:

$$h_0(D)=D^1+D^2+D^3+D^5$$

$$h_1(D)=1+D^1+D^2+D^4+D^5$$

Referring to FIG. 3, the decoder (140) is comprised of two input paths that are XORed (301) to generate the output data. The first input path XORs (312) the first input delayed by one delay unit (302) with the same input delayed by two delay units (302 and 303). The result of this XOR operation (312) is XORed (313) with the first input delayed by three delay units (302–304). The result of this XOR operation (313) is then XORed (314) with the first input signal delayed by five delay units (302–306). The second input path XORs (315) the second input signal with the second input signal delayed by one delay unit (307). The result of this XOR operation (315) is XORed (316) with the second input signal delayed by two delay units (307 and 308). The result of this operation (316) is then XORed (317) with the second input signal delayed by four delay units (307–310). This result is then XORed (318) with the second input signal delayed by five delay units (307–311).

The outputs of the rate-½ decoders (130 and 140) are XORed (170). This function can be accomplished by a hardware XOR gate or by a software process. This output of the XOR operation (170) produces a number of bits in error proportional to the BER of the channel.

A counter (141) keeps track of the number of errors found. The counter (141) is coupled to the output of the XOR operation. This count function can also be a hardware counter or a software process. The output of the count operation is an estimate of the number of bits in error for the user information.

The estimated BER signal is input to a polynomial mapping process (160) that normalizes the estimated BER signal to produce the actual BER of the channel. This process (160) uses a third order polynomial that was experimentally derived by curve fitting the output of the counter to the BER of the channel. This process (160) is needed because for high BER, some errors will overlap and cancel each other out during the XOR operation (170).

The process followed over the FACCH data path is similar to the above described process for the user information path; the main difference being the use of a rate-¼ convolutional encoder to generate the baseband FACCH data signal for transmission. FIG. 1 illustrates the FACCH portion of the BER estimation process of the present invention in conjunction with the surrounding system.

The generator polynomials for the rate-¼ convolutional encoder (101) are:

$$g_0(D)=1+D+D^3+D^4+D^5$$

$$g_1(D)=1+D+D^2+D^4+D^5$$

$$g_2(D)=1+D+D^2+D^3+D^5$$

$$g_3(D)=1+D^2+D^5$$

These equations are referenced in Interim Standard-54 (Rev. A) from the Electronic Industries Association.

Referring to FIG. 1, the FACCH data, from the FACCH message generator (120), are input to the rate-¼ convolutional encoder (101). Redundancy is added in this step to aid in error correction. The convolutionally encoded data stream is transmitted (103) over the channel to be received by a receiver (104). The received convolutionally encoded FACCH data are then input to the BER estimation process (100) of the present invention.

The FACCH data are input to two separate and distinct rate-¼ decoders (107 and 108), each using an inverse of the original generator polynomial. The first rate-¼ decoder (107), illustrated in greater detail in FIG. 4, uses the following polynomials:

$$h_0(D)=1$$

$$h_1(D)=D^2$$

$$h_2(D)=1+D^2$$

$$h_3(D)=1$$

Figure 4:
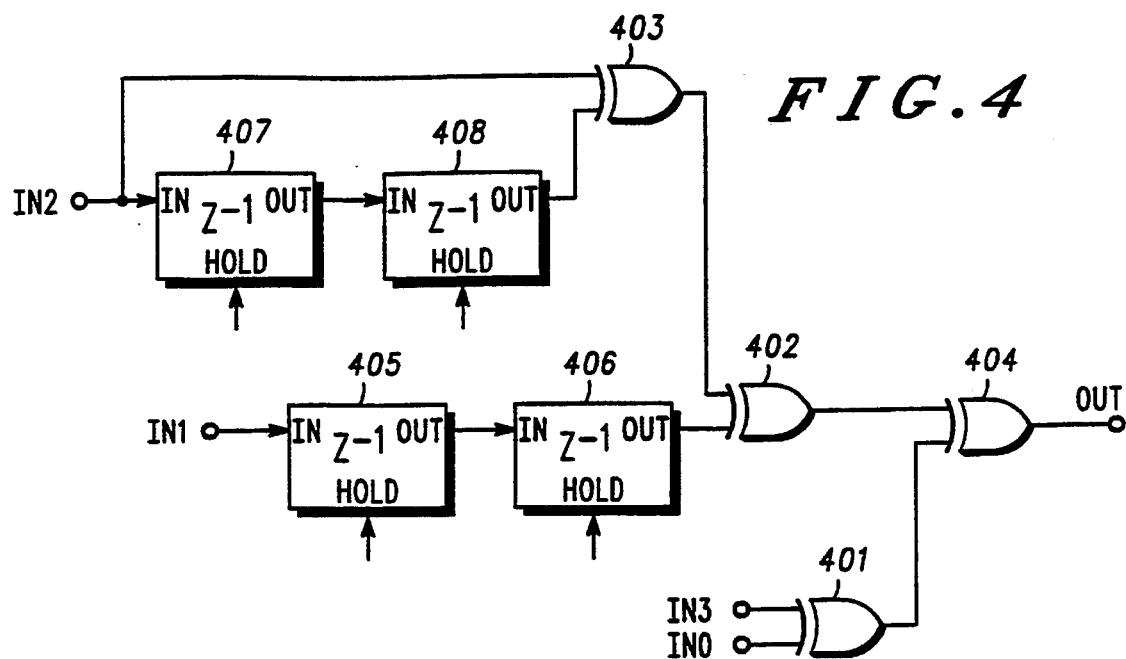
FIG. 4 shows a block diagram of a first rate-¼ decoder.

Referring to FIG. 4, this decoder (107) XORs (403) one of the inputs with the same input delayed by two delay units (407 and 408). The result of this operation (403) is XORed (402) with a second input delayed by two delay units (405 and 406). The result of this XOR operation (402) is XORed (404) with the XOR (401) of the remaining two inputs to generate the output of the decoder (107).

Figure 5:
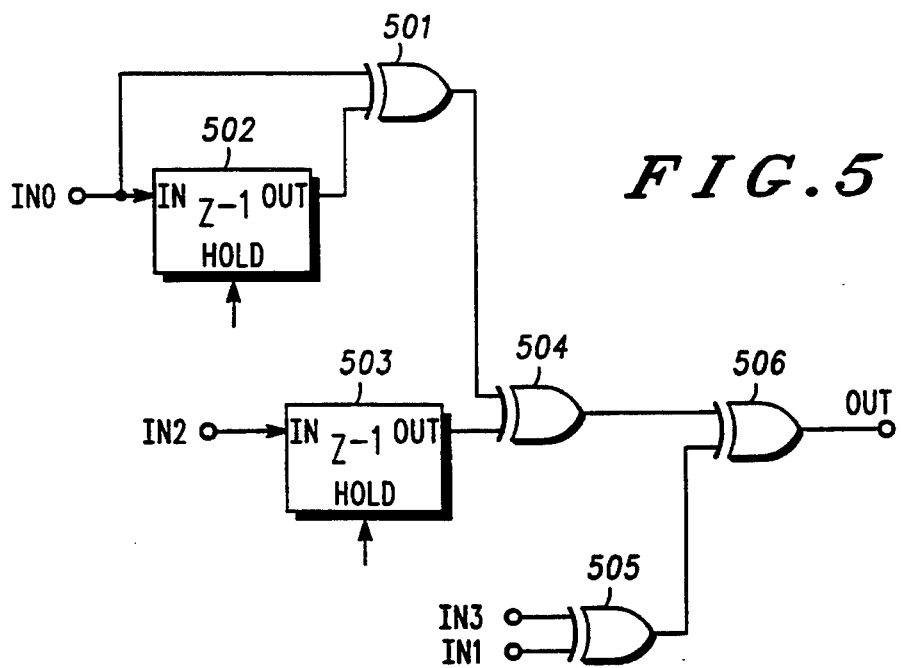
FIG. 5 shows a block diagram of a second rate-¼ decoder.

The second rate-¼ decoder (108), illustrated in greater detail in FIG. 5, uses the following polynomials:

$$h_0(D)=1+D$$

$$h_1(D)=1$$

$$h_2(D)=D$$

$$h_3(D)=1$$

Referring to FIG. 5, this decoder (108) XORs (501) one of the inputs with the same input delayed by one delay unit (502). The output of this XOR operation (501) is XORed (504) with a second input delayed by one delay unit (503). The result of this operation (504) is XORed (506) with the XOR (505) of the remaining two inputs to generate the output of the decoder (108).

The outputs of the rate-¼ decoders (107 and 108) are XORed (109). This function can be accomplished by a hardware XOR gate or by a software process. This output of the XOR operation (109) produces a number of bits in error proportional to the BER of the channel.

A counter (111) keeps track of the number of errors found. The counter (111) is coupled to the output of the XOR operation (109). This count function (111) can also be a hardware counter or a software process. The output of the count operation (111) is the estimated BER for this channel.

The number of bits in error for the FACCH data is input to a polynomial mapping process (112) that normalizes the number of bits of error to produce the estimated BER of the channel. This process (112) uses a third order polynomial that was derived by curve fitting the output of the counter to the BER of the channel. This mapping process (112) is needed because for high BER, some errors will overlap and cancel each other out during the XOR operation (109).

The outputs of the normalizing operations (160 and 112) are input to a summing operation (190). The BER of the FACCH message is subtracted from the BER of the user information. This operation is performed in order to compute the difference so as to be compared to a threshold. The BER difference is then compared to a threshold (191). In the preferred embodiment, this threshold is −0.01. This threshold gives more priority to FACCH data being present than user information data being present.

If the difference is less than or equal to the threshold, the information received by the receiver is a rate-¼ convolutionally encoded FACCH message. The rate-¼ convolutionally encoded FACCH message is sent to a rate-¼ Viterbi decoder (193) where the original FACCH message is recovered. If the difference is greater than the threshold, the information received by the receiver is rate-½ convolutionally encoded user information. The rate-½ convolutionally encoded user information is sent to a rate-½ Viterbi decoder (192) where the original user information is recovered.

While the processes of the present invention, in the preferred embodiment, are implemented as software processes, they can also be implemented as hardware circuits in an alternate embodiment.

The BER estimation process is instrumental in making the proper decision between the two data streams. By choosing the signal with the lowest BER, the selection process of the present invention uses less processor time than previous methods, thereby reducing the power requirements of the processor.

I claim:

1. In a receiver operable to receive an encoded signal generated by one of a plurality of encoding processes, a method for selecting one of a plurality of decoding processes to decode the encoded signal, the method comprising the steps of:

generating a plurality of bit error rate estimates for the encoded signal, wherein the plurality of bit error rate estimates correspond to the encoded signal being generated by the plurality of encoding processes;

determining a bit error rate estimate of the plurality of bit error rate estimates having the most favorable value; and selecting the one of the plurality of decoding processes, corresponding to the one of the plurality of encoding processes, for decoding the encoded signal responsive to the bit error rate estimate having the most favorable value.

2. A method for selecting one of a plurality of decoding processes according to claim 1 wherein the plurality of encoding processes further comprises a rate-¼ convolutional encoding process and a rate-½ convolutional encoding process.

3. A method for selecting one of a plurality of decoding processes according to claim 1 wherein the plurality of decoding processes further comprises a rate-¼ convolutional decoding process and a rate-½ convolutional decoding process.

4. A method for selecting one of a plurality of decoding processes according to claim 1 wherein the step of selecting further comprises the step of favoring at least one of the plurality of decoding processes.

5. In a receiver operable to receive an encoded signal generated by one of a plurality of encoding processes, a method for selecting one of a plurality of decoding processes to decode the encoded signal, the method comprising the steps of:

generating a first bit error rate estimate for the encoded signal, wherein the first bit error rate estimate corresponds to the encoded signal being generated by a first encoding process of the plurality of encoding processes;

generating a second bit error rate estimate for the encoded signal, wherein the second bit error rate estimate corresponds to the encoded signal being generated by a second encoding process of the plurality of encoding processes;

determining which of the first bit error rate estimate and the second bit error rate estimate has the most favorable value; and selecting between a first decoding process of the plurality of decoding processes, corresponding to the first encoding process, responsive to determining that the first bit error rate estimate has the most favorable value, and a second decoding process of the plurality of decoding processes, corresponding to the second encoding process, responsive to determining that the second bit error rate estimate has the most favorable value.

6. A method for selecting one of a plurality of decoding processes according to claim 5 wherein the first and second encoding processes further comprises a rate-¼ convolutional encoding process and a rate-½ convolutional encoding process, respectively.

7. A method for selecting one of a plurality of decoding processes according to claim 5 wherein the first and second decoding processes further comprises a rate-¼ convolutional decoding process and a rate-½ convolutional decoding process, respectively.

8. A method for selecting one of a plurality of decoding processes according to claim 5 wherein the step of selecting further comprises the step of favoring one of the first and second decoding processes.

9. In a radio frequency receiver operable to receive a convolutionally encoded signal generated by one of a plurality of convolutional encoding processes, a method for selecting one of a plurality of convolutional decoding processes to decode the convolutionally encoded signal, the method comprising the steps of:

generating a first bit error rate estimate for the convolutionally encoded signal, wherein the first bit error rate estimate corresponds to the convolutionally encoded signal being generated by a rate-½ convolutional encoding process of the plurality of convolutional encoding processes;

generating a second bit error rate estimate for the convolutionally encoded signal, wherein the second bit error rate estimate corresponds to the convolutionally encoded signal being generated by a rate-¼ convolutional encoding process of the plurality of convolutional encoding processes;

determining which of the first bit error rate estimate and the second bit error rate estimate has the most favorable value; and selecting between a rate-½ convolutional decoding process of the plurality of convolutional decoding processes, corresponding to the rate-½ convolutional encoding process, responsive to determining that the first bit error rate estimate has the most favorable value, and a rate-¼ convolutional decoding process of the plurality of convolutional decoding processes, corresponding to the rate-¼ convolutional encoding process, responsive to determining that the second bit error rate estimate has the most favorable value.

10. A method for selecting one of a plurality of decoding processes according to claim 9 wherein the step of selecting further comprises the step of favoring one of the rate-½ convolutional decoding process and the rate-¼ convolutional decoding process.

11. In a receiver operable to receive an encoded signal generated by one of a plurality of encoding processes, an apparatus for selecting one of a plurality of decoding processes to decode the encoded signal, the apparatus comprising:

a bit error rate estimator for generating a plurality of bit error rate estimates for the encoded signal, wherein the plurality of bit error rate estimates correspond to the encoded signal being generated by the plurality of encoding processes;

a bit error rate estimate quality determiner for determining a bit error rate estimate of the plurality of bit error rate estimates having the most favorable value; and a decoding process selector for selecting the one of the plurality of decoding processes, corresponding to the one of the plurality of encoding processes, for decoding the encoded signal responsive to the bit error rate estimate having the most favorable value.

12. An apparatus for selecting one of a plurality of decoding processes according to claim 11 wherein the plurality of encoding processes further comprises a rate-¼ convolutional encoding process and a rate-½ convolutional encoding process.

13. An apparatus for selecting one of a plurality of decoding processes according to claim 11 wherein the plurality of decoding processes further comprises a rate-¼ convolutional decoding process and a rate-½ convolutional decoding process.

14. An apparatus for selecting one of a plurality of decoding processes according to claim 11 wherein the step of selecting further comprises the step of favoring at least one of the plurality of decoding processes.

15. In a receiver operable to receive an encoded signal generated by one of a plurality of encoding processes, an apparatus for selecting one of a plurality of decoding processes to decode the encoded signal, the apparatus comprising:

a first bit error rate estimator for generating a first bit error rate estimate for the encoded signal, wherein the first bit error rate estimate corresponds to the encoded signal being generated by a first encoding process of the plurality of encoding processes;

a second bit error rate estimator for generating a second bit error rate estimate for the encoded signal, wherein the second bit error rate estimate corresponds to the encoded signal being generated by a second encoding process of the plurality of encoding processes;

a bit error rate estimate quality determiner for determining which of the first bit error rate estimate and the second bit error rate estimate has the most favorable value; and a decoding process selector for selecting between a first decoding process of the plurality of decoding processes, corresponding to the first encoding process, responsive to determining that the first bit error rate estimate has the most favorable value, and a second decoding process of the plurality of decoding processes, corresponding to the second encoding process, responsive to determining that the second bit error rate estimate has the most favorable value.

16. An apparatus for selecting one of a plurality of decoding processes according to claim 15 wherein the first and second encoding processes further comprises a rate-¼ convolutional encoding process and a rate-½ convolutional encoding process, respectively.

17. An apparatus for selecting one of a plurality of decoding processes according to claim 15 wherein the first and second decoding processes further comprises a rate-¼ convolutional decoding process and a rate-½ convolutional decoding process, respectively.

18. An apparatus for selecting one of a plurality of decoding processes according to claim 15 wherein the step of selecting further comprises the step of favoring one of the first and second decoding processes.

19. In a radio frequency receiver operable to receive a convolutionally encoded signal generated by one of a plurality of convolutional encoding processes, an apparatus for selecting one of a plurality of convolutional decoding processes to decode the convolutionally encoded signal, the apparatus comprising:

a first bit error rate estimator for generating a first bit error rate estimate for the convolutionally encoded signal, wherein the first bit error rate estimate corresponds to the convolutionally encoded signal being generated by a rate-½ convolutional encoding process of the plurality of convolutional encoding processes;

a second bit error rate estimator for generating a second bit error rate estimate for the convolutionally encoded signal, wherein the second bit error rate estimate corresponds to the convolutionally encoded signal being generated by a rate-¼ convolutional encoding process of the plurality of convolutional encoding processes;

a bit error rate estimate quality determiner determining which of the first bit error rate estimate and the second bit error rate estimate has the most favorable value; and a decoding process selector for selecting between a rate-½ convolutional decoding process of the plurality of convolutional decoding processes, corresponding to the rate-½ convolutional encoding process, responsive to determining that the first bit error rate estimate has the most favorable value, and a rate-¼ convolutional decoding process of the plurality of convolutional decoding processes, corresponding to the rate-¼ convolutional encoding process, responsive to determining that the second bit error rate estimate has the most favorable value.

20. An apparatus for selecting one of a plurality of decoding processes according to claim 19 wherein the step of selecting further comprises the step of favoring one of the rate-½ convolutional decoding process and the rate-¼ convolutional decoding process.

21. A communication system comprising:

a transmitter operable to transmit an encoded signal generated by one of a plurality of encoding processes;

a receiver comprising:
   a receiver operable to receive the encoded signal;
   a bit error rate estimator for generating a plurality of bit error rate estimates for the encoded signal, wherein the plurality of bit error rate estimates correspond to the encoded signal being generated by the plurality of encoding processes;
   a bit error rate estimate quality determiner for determining a bit error rate estimate of the plurality of bit error rate estimates having the most favorable value; and
   a decoding process selector for selecting the one of the plurality of decoding processes, corresponding to the one of the plurality of encoding processes, for decoding the encoded signal responsive to the bit error rate estimate having the most favorable value.

22. A method of operating a communication system including a transmitter and a receiver, the method comprising the steps off in the transmitter, transmitting an encoded signal generated by one of a plurality of encoding processes;

in the receiver:
   receiving the encoded signal;
   generating a plurality of bit error rate estimates for the encoded signal, wherein the plurality of bit error rate estimates correspond to the encoded signal being generated by the plurality of encoding processes;
   determining a bit error rate estimate of the plurality of bit error rate estimates having the most favorable value; and
   selecting the one of the plurality of decoding processes, corresponding to the one of the plurality of encoding processes, for decoding the encoded signal responsive to the bit error rate estimate having the most favorable value.

* * * * *